(12) United States Patent
Schnell

(10) Patent No.: US 6,456,130 B1
(45) Date of Patent: Sep. 24, 2002

(54) DELAY LOCK LOOP AND UPDATE METHOD WITH LIMITED DRIFT AND IMPROVED POWER SAVINGS

(75) Inventor: Josef Schnell, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/758,479

(22) Filed: Jan. 11, 2001

(51) Int. Cl.[7] .................................................. H03L 7/06
(52) U.S. Cl. ........................................ 327/156; 327/158
(58) Field of Search ................................ 327/156, 158, 327/160, 153, 151, 149, 146, 265, 270, 271, 273, 277, 279, 286, 284; 375/215, 226, 375, 376

(56) References Cited

U.S. PATENT DOCUMENTS

| | | | |
|---|---|---|---|
| 5,994,938 A | * 11/1999 | Lesmeister | 327/277 |
| 6,043,694 A | 3/2000 | Dortu | 327/156 |
| 6,047,346 A | * 4/2000 | Lau et al. | 327/158 |
| 6,100,733 A | 8/2000 | Dortu et al. | 327/149 |
| 6,125,157 A | * 9/2000 | Donnelly et al. | 327/158 |
| 6,127,866 A | 10/2000 | Chu et al. | 327/158 |
| 6,137,327 A | * 10/2000 | Schnell | 327/158 |
| 6,140,854 A | * 10/2000 | Coddington et al. | 327/158 |
| 6,198,689 B1 | * 3/2001 | Yamazaki et al. | 327/156 |

* cited by examiner

Primary Examiner—Timothy P. Callahan
Assistant Examiner—Linh Nguyen
(74) Attorney, Agent, or Firm—Stanton Braden

(57) ABSTRACT

A delay lock loop circuit, in accordance with the present invention includes a delay lock loop unit having a power down mode. The delay lock loop unit includes a delay line having an input and an output. The input receives a first clock signal to generate a modified clock signal at the output. A phase detector is coupled to the input and the output of the delay line for comparing the first clock signal and the modified clock signal. A delay line control unit is coupled to the phase detector and the delay line for adjusting delay in the delay line in accordance with a control signal from the phase detector. A counter circuit is included for updating the delay lock loop unit to account for delay line drift during the power down mode by periodically generating an update signal which permits the delay lock loop unit to update in the power down mode.

20 Claims, 3 Drawing Sheets

DELAY LOCK LOOP AND UPDATE METHOD WITH LIMITED DRIFT AND IMPROVED POWER SAVINGS

BACKGROUND

1. Technical Field

This disclosure relates to delay lock loops, and more particularly, to an apparatus and method for limiting drift due to temperature and noise variation while reducing power consumption of the apparatus.

2. Description of the Related Art

Semiconductor memories, such as synchronous dynamic random access memories (SDRAMs) and specific Double Data Rate (DDR) memories, typically include delay lock loops (DLLs). DLLs function to cancel on-chip amplification and buffering delays, and DLLs improve input/output timing margins. DDR SDRAMs are designed such that READ/WRITE data on output lines (DQ pins) are synchronized to a system clock (e.g., CK/bCK).

Referring to FIG. 1, a schematic diagram of a conventional DLL circuit 8 includes a receiver 10 for receiving clock input signals, CK and bCK. An input driver 12 receives an amplified clock pulse from receiver 10 and conditions the signal as is known in the art (e.g., pulse generation). Input driver 12 outputs the clock signal to a delay line 14 which includes a plurality of delay elements and a phase detector (PD) 16 (Ref_clock). Elements of delay line 14 include inverter chains or other delay elements to delay the clock signal in accordance with a phase comparison between Ref_clock and a feedback clock signal (FB_clock, which is delayed in accordance with elements 14). Phase detector 16 receives both Ref_clock and FB_clock signals and compares the phase to determine delay differences between the signals. Phase detector 16 generates a control signal, which indicates to a delay line (DL) control unit 20 to increment (+), decrement (−) or lock (0) delay elements in delay line 14. DL control unit 20 (also called a pointer control unit) responds by sending a signal to increment/decrement (inc/dec) delay line 14 or by locking the DLL 8. The output clock signal of delay line 14 is employed to drive an output pin driver (QS or DQ) driver 22. Driver 22 is employed to clock data transfer from/to the chip.

For power reduction, a Power Down Mode is employed in which the Clock/DLL path is disabled and pointer control unit 20 maintains its settings. DLL temperature and noise drifts are experienced between entry and exit of the power down mode.

In DDR SDRAMs, DLLs are required to synchronize the output pins (e.g., DQs) to the system clock CK/bCK in a read operation. DDR SDRAM specifications may optionally require DLL updates with every Auto Refresh (AR) cycle. Auto refresh (AR) cycles refresh memory cells according to word lines. AR cycles may include burst cycles where memory cells associated with all gate lines are refreshed in a same time window. AR cycles may also be performed on word lines a little at a time (several word lines at a time, i.e., in pieces) over a longer time window. The DLL off function reduces the DLL current in the Power Down mode. The problem with updating only during AR cycles is the DLL drift due to temperature and noise variations in between these AR cycles. This drift gets worse during Power Down mode while the DLL is disabled. Measurements on the chip show DLL drift between AR cycles for 8 burst AR cycles.

DLL updates enabled during Auto Refresh cycles and DLL drift due to temperature and noise between AR cycles is possible, causing variations in the data valid window during read cycles. Therefore, a need exists for an apparatus and method for reducing drift in delay lock loop circuits.

SUMMARY OF THE INVENTION

A delay lock loop circuit, in accordance with the present invention includes a delay lock loop unit having a power down mode. The delay lock loop unit includes a delay line having an input and an output. The input receives a first clock signal to generate a modified clock signal at the output. A phase detector is coupled to the input and the output of the delay line for comparing the first clock signal and the modified clock signal. A delay line control unit is coupled to the phase detector and the delay line for adjusting delay in the delay line in accordance with a control signal from the phase detector. A counter circuit is included for updating the delay lock loop unit to account for delay line drift during the power down mode by periodically generating an update signal which enables the delay lock loop unit for updating.

A delay lock loop circuit for driving data for a memory chip includes a receiver for outputting an amplified clock signal to an input driver circuit. The input driver is coupled to the receiver and generates clock pulses for a first clock signal. A delay lock loop unit has a power down mode and a normal operation mode. A delay line has an input and an output. The input of the delay line receives the first clock signal to generate a modified clock signal at the output. A phase detector is coupled to the input and the output of the delay line for comparing the first clock signal and the modified clock signal and generates a control signal in accordance with the comparison. A delay line control unit is coupled to the phase detector and the delay line to adjust delay in the delay line in accordance with the control signal from the phase detector. A clock counter circuit is included for updating the delay lock loop unit to account for delay line drift during the power down mode by periodically generating an update signal, which permits the delay lock loop unit to update in the power down mode. A data driver is enabled in the normal operation mode by the modified clock to drive data for the memory chip in accordance with the modified clock signal.

In other embodiments, the counter circuit may include an oscillator for tracking time between update signals. The oscillator may include an operating frequency of less than or equal to 1 MHz. The counter circuit may include a counter coupled to the oscillator for counting a number of clock cycles such that when the number of clock cycles exceeds a threshold the update signal is generated. A memory device may be coupled to the counter for providing the threshold such that the threshold defines the time elapsed between update signals. The memory device may include at least one of a fuse block and a metal option. The counter circuit is preferably turned on when the delay lock unit is locked. The predetermined number of cycles enables the unlock signal between auto refresh (AR) cycles.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides an apparatus and method which provide an update of a delay lock loop (DLL) circuit to account for drift due to, for example, noise and temperature. In one embodiment, a low frequency update signal is provided to update a delay lock loop during power down mode or in between AR updates. The low frequency update of the DLL may be at a frequency of, for example, less than or equal to 1 MHz. The update advantageously eliminates drift of the DLL between AR cycles and during power down mode.

Figure 1:
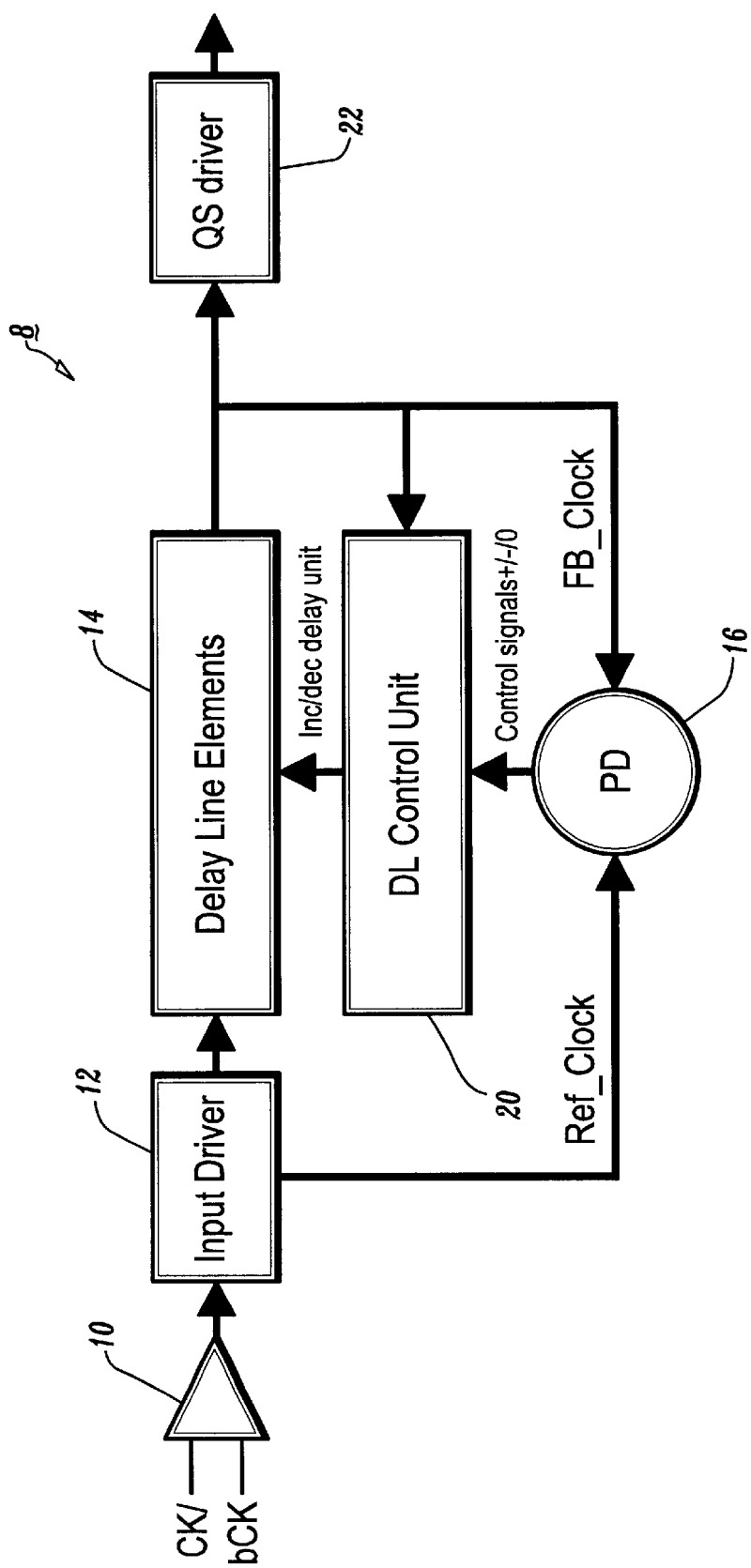
FIG. 1 is a schematic diagram showing a conventional delay lock loop.
Figure 2:
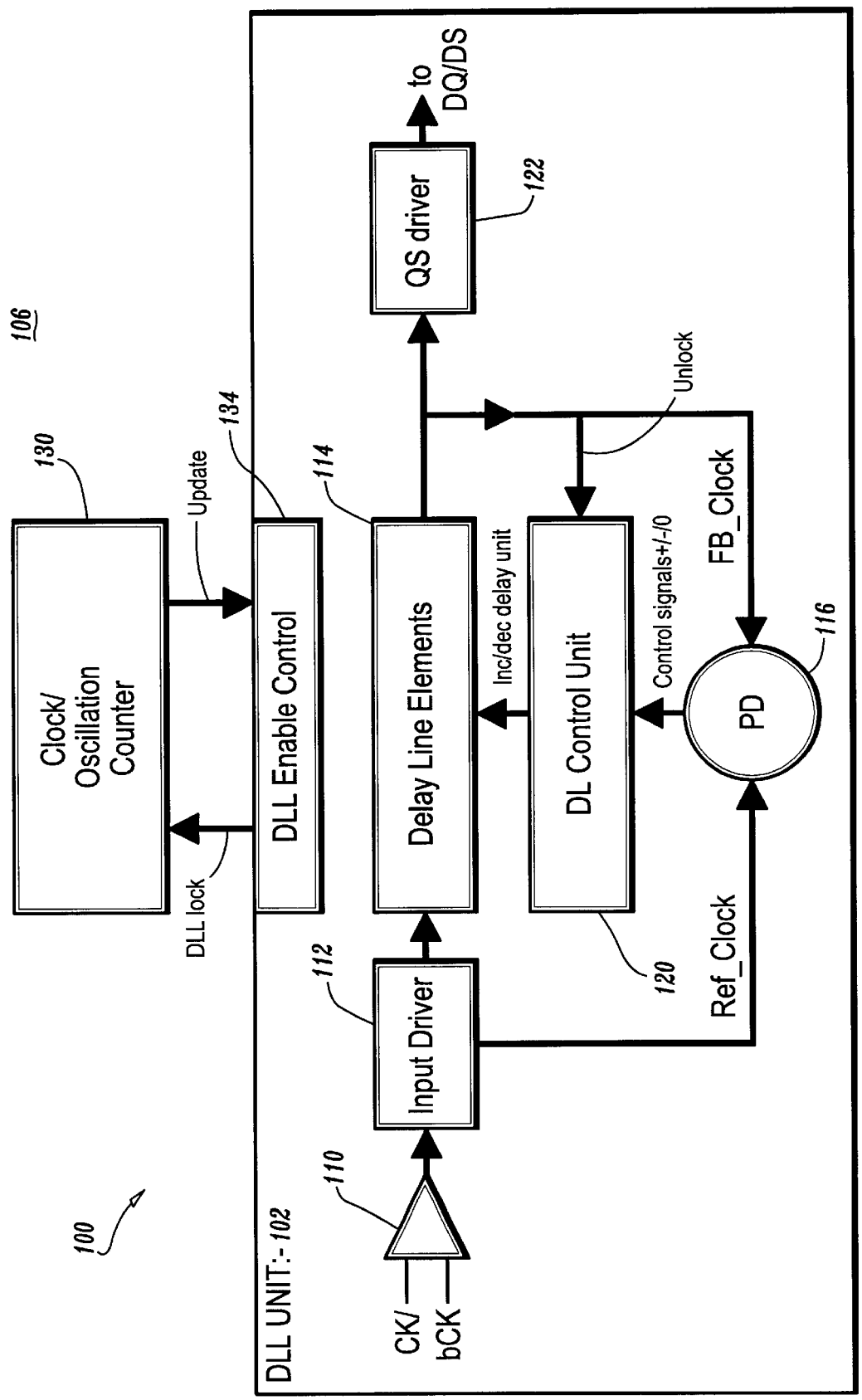
FIG. 2 is a schematic diagram showing an embodiment of a delay lock loop circuit with counters employed for triggering updates in the delay path in accordance with the present invention.

Referring now in specific detail to the drawings in which like reference numerals identify similar or identical elements throughout the several views, and initially to FIG. 2, a delay lock loop (DLL) circuit 100 is shown in accordance with one illustrative embodiment of the present invention. DLL 100 includes a DLL unit 102 including a receiver 110 for receiving clock input signals, CK and bCK. Clock input signals, CK and bCK, are complementary signals and represent a system clock of a chip 106 on which DLL unit 102 is formed. Chip 106 preferably includes a memory chip, such as a dynamic random access memory (DRAM), synchronous DRAM (SDRAM), double data rate (DDR) SDRAM or the like. The present invention should not be construed as limited by the illustrative embodiment and may be employed in a plurality of different devices including processors or other circuits which suffer from DLL drift.

When the DLL unit 102 is activated (e.g., normal or power on mode), an input driver 112 receives an amplified clock pulse from receiver 110 and splits and conditions the signal as is known in the art (e.g., clock pulse generation). Input driver 112 outputs the split clock signal to a delay line 114 and a phase detector (PD) 116. The clock signal from input driver 112 to phase detector is employed as a reference clock signal (Ref_clock).

Delay line 114 includes a plurality of delay elements. Elements of delay line 114 may include one an inverter chain or other delay elements (e.g., resistor capacitor elements) to delay the clock signal in accordance with a phase comparison between Ref_clock and a feedback clock signal (FB_clock, which is delayed in accordance with elements of delay line 114). Delay adjustments to delay line 114 are made by enabling or disabling delay elements. Phase detector 116 receives both Ref_clock and FB_clock signals and compares the phase to determine delay differences between the signals. Phase detector 116 generates a control signal, which indicates to a delay line (DL) control unit 120 whether to increment (+), decrement (−) or lock (0) delay elements in delay line 114. DL control unit or pointer control unit 120 responds by sending a signal to increment/decrement (inc/dec) delay line 114 or by locking DLL unit 102. The inc/dec signal enables or disables delay elements to adjust the amount of delay in a clock signal traveling through delay line 114. The output clock signal of delay line 114 is employed to drive an output pin driver (QS or DQ) driver 122. Driver 122 is employed to clock data transfer from/to chip 106 in normal operation.

Figure 3:
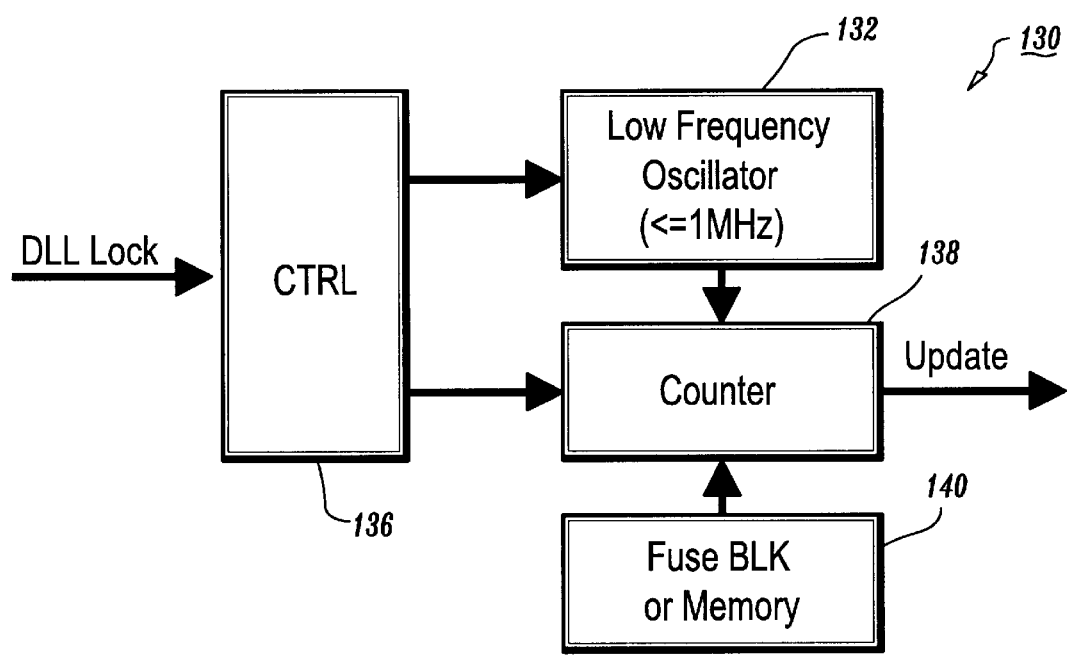
FIG. 3 is a schematic diagram showing an oscillation counter in accordance with the present invention.

For power reduction, in a Power Down Mode, the clock/DLL path is disabled. A programmable oscillator/clock counter 130 is employed to provide DLL unit updates between AR cycles. In a preferred embodiment, counter 130 operates with a low frequency oscillator 132 (FIG. 3). Low frequency oscillator (LFO) 132 preferably operates at or below 1 MHz. Counter 130 counts oscillations or pulses (e.g., analog or digital) of LFO 132 (FIG. 3) generates an UPDATE signal when a predetermined number of cycles have been counted. While in power down the DLL and clock path can be disabled for power savings, the UPDATE signal enables DLL unit 102 and updates DLL unit 102 by running DLL unit 102. DLL unit 102 is therefore checked and corrected for drift intermittently in power down mode with each update command from oscillator counter circuit 130.

The UPDATE signal is employed to enable a DLL enable control circuit 134. Circuit 134 when activated turns DLL unit 102 on if in power down mode so that drift compensation is performed. Data is not transferred during this enablement of DLL unit 102, but clock CK and bCK are permitted through receiver 110 and into delay line 114 as in normal operation to compare Ref_clock to FB_clock. DLL enable control 134 provides the power up/down of the DLL in predetermined steps, e.g.:

1. Power on/off receiver clock 110,
2. Synchronize DL control unit 120 with clock from input driver 112 and delay line element 114, and
3. Enable phase detector 116, etc.

When DLL unit 102 locks, a DLL power down mode is preferably entered and a DLL LOCK signal is generated, which indicates that DLL unit 102 is currently locked. The DLL LOCK signal may be employed to trigger counter 130, as illustratively shown in Table 1.

TABLE 1

| LFO counter functionality in terms of signals. | |
|---|---|
| DLL LOCK | UPDATE |
| = 0, DLL is currently updating - after power on or AR update command | = 0, reset counter, oscillator off |
| = 1, DLL locked | = 1, oscillator on, 1st pulse occurs a preset time after DLL LOCK = 1 |

Counter 130 and LFO 132 (FIG. 2) may be employed in normal operation mode as well. In this way, after a predetermined number of clock cycles or after a predetermined amount of time has elapsed after DLL LOCK has been generated, an UPDATE signal is generated to update DLL unit 102. Thus, reducing DLL drift in normal operation and/or in Power Down mode. Table 2 shows possible scenarios for updating DLL unit 102.

TABLE 2

| | Normal mode | Power Down mode |
|---|---|---|
| AR update | Yes | No |
| LFO Counter update | possible | update |

Referring to FIG. 3, oscillator counter 130 is shown in greater detail in accordance with one embodiment of the present invention. DLL LOCK signal is received by a control circuit 136. Control circuit 136 includes logic for generating enable signals for turning on oscillator 132 and a counter 138. Counter 138 counts clock cycles of oscillator 132 to determine when an UPDATE signal is to be output from counter 138. UPDATE is generated when a threshold number of clock cycles have elapsed. A memory device 140 is preferably included. Memory device 140 may include a fuse block, which may be trimmed or programmed to set the threshold number of cycles (e.g., delay the output of UPDATE after DLL LOCK is received). The threshold number of cycles may be programmed by metal option (patterned circuit) with a circuit hardwired to define the number of cycles (e.g., delay the output of UPDATE after DLL LOCK is received). Comparison logic, known in the art, is used to compare the threshold number of cycles stored in device 140 with the value in counter 138. If the value of counter 138 exceeds the threshold value, UPDATE is generated and the counter is reset to zero. Counting and updating continues while DLL unit 102 (FIG. 2) is locked. Otherwise, oscillator counter 130 is turned off.

Figure 4:
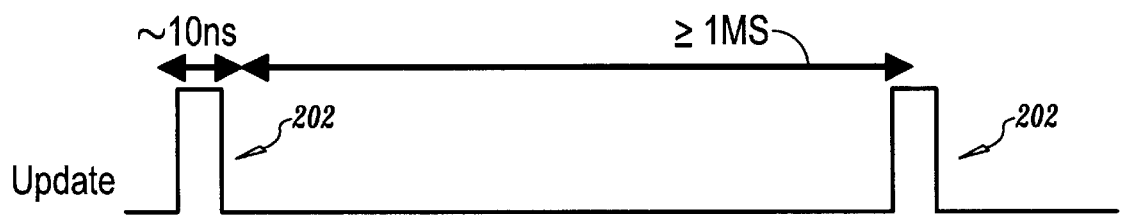
FIG. 4 is a timing diagram showing an illustrative update signal.

Referring to FIG. 4, an illustrative timing diagram is shown for an UPDATE signal. In one embodiment, UPDATE signal 202 is high for about 10 ns. Greater than about 1 microsecond, preferably between 1 and 10 microseconds, is permitted to elapse between high UPDATE signals 202. This elapsed time between UPDATE signals is controlled through memory device 140, for example, by programming fuses to achieve the desired elapsed time of providing a number of clock cycles which must elapse before generating UPDATE.

Having described preferred embodiments for improved delay lock loop and update method with limited drift and improved power savings (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A delay lock loop circuit comprising:
   a delay lock loop unit having a power down mode; and
   a counter unit for periodically generating an update signal during the power down mode wherein the update signal periodically enables the delay lock loop unit to compensate for delay line drift by permitting the delay lock loop unit to update during the power down mode;
   wherein said delay lock loop unit comprises:
      a delay line having an input, a control terminal and an output, said input for receiving a first clock signal to generate a modified clock signal at said output;
      a phase detector having a first input coupled to said input of said delay line and a second input coupled to said output of said delay line for providing an output indicative of a phase difference between the first clock signal and the modified clock signal; and
      a delay line control unit coupled to said output of said phase detector, said output of said delay line and said control terminal of said delay line for adjusting delay in the delay line in accordance with a control signal from the phase detector.

2. The circuit as recited in claim 1 wherein the counter unit comprises an oscillator for tracking time between update signals.

3. The circuit as recited in claim 2 wherein the oscillator has an operating frequency of less than or equal to 1 million cycles per second (MHz).

4. The circuit as recited in claim 2 wherein the counter unit comprises a counter coupled to the oscillator for counting a number of cycles such that when the number of cycles exceeds a threshold the update signal is generated.

5. The circuit as recited in claim 4, further comprising a memory device coupled to the counter for providing the threshold such that the threshold defines the time elapsed between update signals.

6. The circuit as recited in claim 5, wherein the memory device includes at least one of a fuse block and a metal option.

7. The circuit as recited in claim 1 wherein the counter unit is turned on when the delay lock loop unit is locked.

8. A delay lock loop circuit for driving data for a memory chip, said circuit comprising:
   a delay lock loop unit having a power down mode and a normal operation mode;
   a counter unit for periodically generating an update signal during the power down mode wherein the update signal periodically enables the delay lock loop unit to compensate for delay line drift by permitting the delay lock loop unit to update during the power down mode; and
   a data driver enabled by a modified clock signal from said delay lock loop unit in the normal operation mode to drive data for the memory chip in accordance with the modified clock signal;
   wherein said delay lock loop unit comprises:
      a receiver for outputting an amplified clock signal to an input driver, the input driver being coupled to the receiver for generating clock pulses for a first clock signal;
      a delay line having an input, a control terminal and an output, the input for receiving the first clock signal to generate the modified clock signal at the output;
      a phase detector having a first input coupled to said input of said delay line and a second input coupled to said output of said delay line for comparing the phases of the first clock signal and the modified clock signal and generating a control signal in accordance with the comparison; and
      a delay line control unit coupled to said output of said phase detector, said output of said delay line and said control terminal of said delay line for adjusting delay in the delay line in accordance with the control signal from the phase detector.

9. The circuit as recited in claim 8 wherein the counter unit comprises an oscillator for tracking time between update signals.

10. The circuit as recited in claim 9 wherein the oscillator includes an operating frequency of less than or equal to 1 million cycles per second (MHz).

11. The circuit as recited in claim 10 wherein the counter circuit includes a counter coupled to the oscillator for counting a number of cycles such that when the number of cycles exceeds a threshold the update signal is generated.

12. The circuit as recited in claim 8, further comprising a memory device coupled to the counter for providing the threshold such that the threshold defines the time elapsed between update signals.

13. The circuit as recited in claim 12 wherein the memory device comprises at least one of a fuse block and a metal option.

14. The circuit as recited in claim 8 wherein the counter circuit is turned on when the delay lock loop unit is locked.

15. The circuit as recited in claim 8, wherein the delay lock loop circuit is included on a memory chip and wherein the unlock signal is provided between auto refresh (AR) cycles of the memory chip.

16. A delay lock loop circuit comprising:

means for providing a delay lock loop during a power down mode; and means for updating the delay lock loop to account for delay line drift during the power down mode by periodically generating an update signal that permits the delay lock loop circuit to update during the power down mode;

wherein said providing means comprises:

means for delaying a first clock signal to generate a modified clock signal;

means for detecting a phase difference between the first clock signal and the modified clock signal; and means for adjusting said delaying means in accordance with said detecting means.

17. A method for updating a delay lock loop circuit, the method comprising:

providing a delay lock loop during a power down mode; and updating the delay lock loop to account for delay line drift during the power down mode by periodically generating an update signal that permits the delay lock loop circuit to update during the power down mode;

wherein said providing comprises:

delaying a first clock signal to generate a modified clock signal;

detecting a phase difference between the first clock signal and the modified clock signal; and adjusting a delay of the modified clock signal in accordance with said detected phase difference.

18. The circuit as recited in claim 1, further comprising a delay lock loop enable control unit coupled to the counter unit for periodically receiving the update signal during a power down mode and controllably enabling the delay lock loop unit in response thereto.

19. The circuit as recited in claim 18 wherein the delay lock loop unit further comprises the delay lock loop enable control unit.

20. The circuit as recited in claim 19 wherein the delay lock loop unit further comprises a receiver for outputting an amplified clock signal to an input driver, the input driver being coupled to the receiver for generating clock pulses for a first clock signal.

* * * * *